US008563858B2

(12) United States Patent
Gladden, Jr. et al.

(10) Patent No.: US 8,563,858 B2
(45) Date of Patent: Oct. 22, 2013

(54) SLIDE MECHANISM

(75) Inventors: Guy W. Gladden, Jr., Washougal, WA (US); John Merritt, Brooklyn, NY (US); Kent Jeffrey Kallsen, Jefferson, WI (US); Knute Palmer Alstad, Sun Prairie, WI (US); David James Gennrich, Fitchburg, WI (US); Stanley R. Swiencicki, Whitestone, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 193 days.

(21) Appl. No.: 12/511,936

(22) Filed: Jul. 29, 2009

(65) Prior Publication Data

US 2011/0024154 A1 Feb. 3, 2011

(51) Int. Cl.
*H05K 5/03* (2006.01)
*F16C 29/02* (2006.01)
*B23P 19/00* (2006.01)

(52) U.S. Cl.
USPC .................................. 174/66; 384/26; 384/42

(58) Field of Classification Search
USPC ............................................................ 174/66
See application file for complete search history.

(56) References Cited

U.S. PATENT DOCUMENTS

| | | | | |
|---|---|---|---|---|
| 3,746,923 | A * | 7/1973 | Spira et al. | 315/291 |
| 4,880,950 | A * | 11/1989 | Carson et al. | 200/547 |
| D380,451 | S | 7/1997 | Krajci et al. | |
| 6,037,553 | A | 3/2000 | Stewart et al. | |
| 6,218,617 | B1 | 4/2001 | Estanislao et al. | |
| 6,967,301 | B2 | 11/2005 | Krajci et al. | |
| D517,999 | S | 3/2006 | Merritt et al. | |
| D518,000 | S | 3/2006 | Merritt et al. | |
| D519,466 | S | 4/2006 | Merritt et al. | |
| D521,944 | S | 5/2006 | Lombardi et al. | |
| D526,624 | S | 8/2006 | Merritt et al. | |
| D534,873 | S | 1/2007 | Merritt et al. | |
| D535,627 | S | 1/2007 | Merritt et al. | |
| 7,170,022 | B2 * | 1/2007 | Krajci et al. | 200/547 |
| D542,230 | S | 5/2007 | Merritt et al. | |
| D543,159 | S | 5/2007 | Merritt et al. | |
| D553,102 | S | 10/2007 | Merritt et al. | |
| 7,497,582 | B1 * | 3/2009 | Savicki, Jr. | 362/95 |

FOREIGN PATENT DOCUMENTS

| | | |
|---|---|---|
| CN | 3387610 | 8/2004 |
| CN | 2745274 | 12/2005 |
| CN | 3505376 | 2/2006 |
| CN | 3506434 | 2/2006 |

* cited by examiner

*Primary Examiner* — William H Mayo, III
*Assistant Examiner* — Hiram E Gonzalez
(74) *Attorney, Agent, or Firm* — Marger Johnson & McCollom PC

(57) ABSTRACT

A system including a plate; at least one guide coupled to the plate; and a slide coupled to the at least one guide. The slide includes a first arm constrained by the at least one guide; and a second arm coupled to the first arm. The slide can be moved along the at least one guide.

26 Claims, 6 Drawing Sheets

SLIDE MECHANISM

BACKGROUND

Lighting and other electrical loads can have a variable control. For example, intensity of a light can be controlled by a dimming control. Such control can be accomplished using a potentiometer. The setting of the potentiometer can correspond to a desired output level.

Such dimming controls can use a potentiometer having a linear actuator, a rotary actuator, or the like. When a linear actuator is used, a slide mechanism can be used as an interface for a user. With a slide mechanism, the actuator can be moved linearly rather than rotated as with a rotary potentiometer. An aesthetically pleasing knob can be attached to the actuator of the potentiometer. However, a gap in a plate of the slide mechanism that allows the actuator to have a range of motion can expose the potentiometer and potentially other internal structures and circuitry.

DETAILED DESCRIPTION

Some of the inventive principles of this patent disclosure relate to a slide mechanism for control of lighting and other electrical loads.

Figure 1:
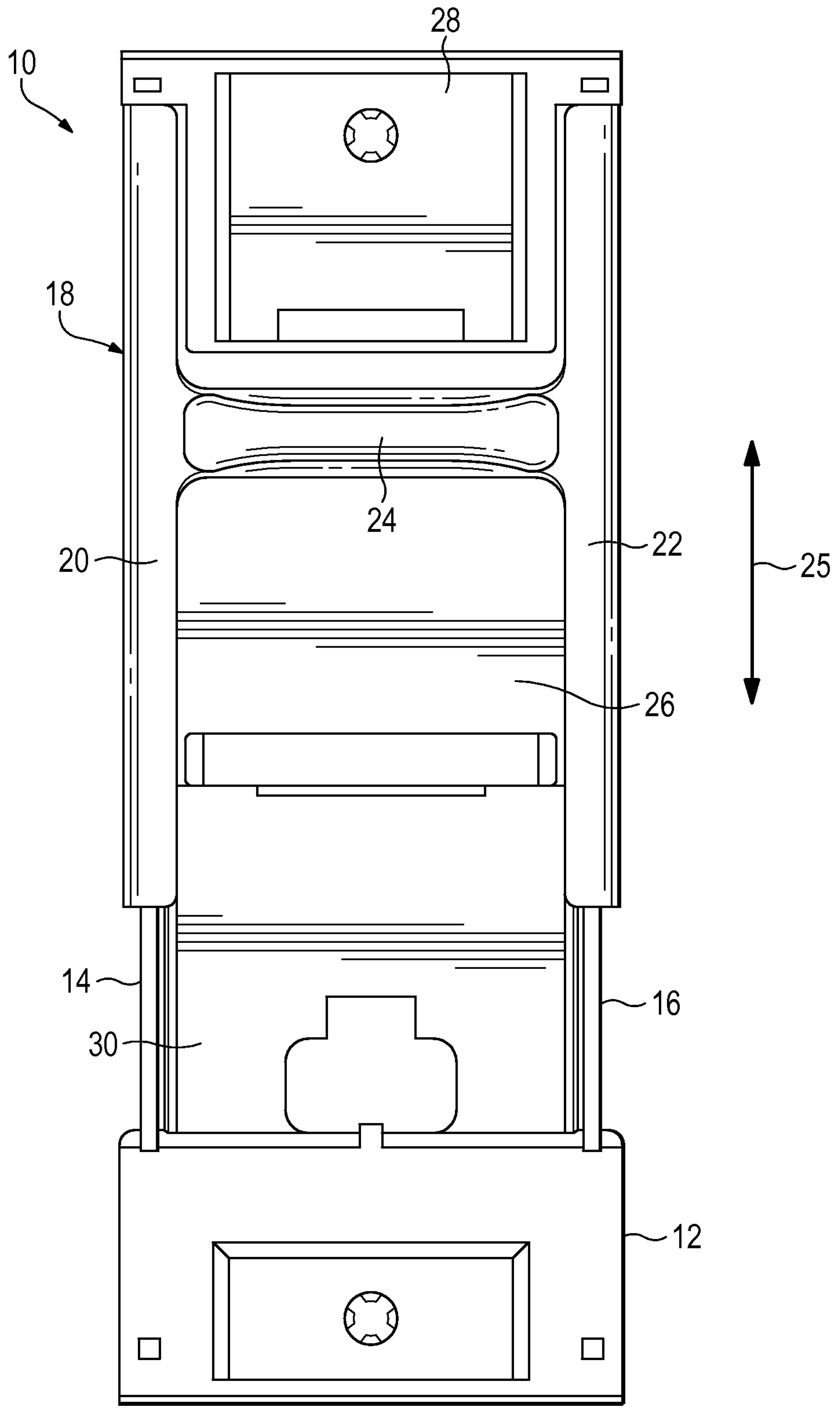
FIG. 1 illustrates an embodiment of a slide mechanism according to some of the inventive principles of this patent disclosure.

FIG. 1 illustrates an embodiment of a slide mechanism according to some of the inventive principles of this patent disclosure. In this embodiment, the slide mechanism 10 includes a plate 12, a first guide 14, a second guide 16, and a slide 18. The first guide 14 and the second guide 16 are coupled to the plate 12. A guide can be a structure that is coupled to the plate, part of the plate, or the like that can constrain the motion of the slide 18.

In this embodiment, the slide 18 includes a first arm 20, a second arm 22, and a third arm 24 coupled between the first arm 20 and the second arm 22. The first arm 20 is constrained by the first guide 14. The second arm 22 is constrained by the second guide 16. As used herein, constrained includes limited in at least one direction of movement. For example, the first guide 14 limits the movement of the first arm 20, and hence the slide 18, towards the plate 12. Similarly, the second guide 16 limits the movement of the second arm 22, and again the slide 18, towards the plate 12, albeit in an opposite direction.

The first arm 20 can be substantially parallel to the second arm 22. Similarly, the first guide 14 and the second guide 16 can be substantially parallel to each other. Accordingly, the slide 18 can be moved along the guides 14 and 16. For example, a user can apply pressure to the third arm 24 to move the slide 18 to a desired position. The pressure can include a force aligned with axis 25. However, any force applied angularly offset from the axis 25, offset from a center of mass of the slide 18, or the like can cause the slide 18 to attempt to rotate. The first arm 20 and the second arm 22 as constrained by the corresponding guides 14 and 16, can reduce the rotation and redirect such forces to be along axis 25.

Since the first arm 20 and the second arm 22 extend from the third arm 24, an amount of unconstrained rotation can be limited. For example, the arms 20 and 22 can be separated from the guides 14 and 16 by a particular gap, such as a gap due to mechanical tolerances, design, or the like. An angle of rotation sufficient to induce a movement to close the gap and cause contact between the arms 20 and 22 and the guides can be inversely related to the length of the arms. That is, the further an end of the arms 20 or 22 from the third arm 24, the less rotation is needed to close the gap. Accordingly, an extent of the arms 20 and 22 can be greater than an extent to the third arm 24 along the axis 25. Thus, the slide 18 is more likely to travel in the intended direction.

Such rotation can cause the arms 20 and 22 to contact with the guides, causing friction. However, due to the length of the arms 20 and 22, a smaller component of the applied force can be applied to the guides 14 and/or 16. This contact can occur between the arms 20 and 22 and the guides 14 and 16 at a location offset from the third arm 24. The force inducing the rotation, a component of the force substantially orthogonal to the axis 25, or the like can be counteracted by the contact of the arms 20 and 22 and the guides 14 and 16. Accordingly, an amount of friction can be reduced, consequently reducing potential binding, seizing, or the like.

In an embodiment, the first guide 14 and the second guide 16 can be formed of material different from the first arm 20 and the second arm 22. In particular, the different materials can be materials that have a relatively reduced friction when in contact. For example, a metal to metal contact can have a first coefficient of friction. However, a metal to plastic contact can have a second, lower coefficient of friction.

In an embodiment, the first arm 20 and the second arm 22 can be formed of a plastic. The guides 14 and 16 can be formed of a metal. Accordingly, the slide 18 can have a reduced friction with the guides 14 and 16 than if the slide 18 and guides 14 and 16 were formed from the same material. In another embodiment, the types of materials can be reversed. For example, the guides 14 and 16 can be plastic while the arms 20 and 22 can be metal. Thus, a metal to plastic interface can be achieved.

In an embodiment, the plate 12 can include a slide region 26. A slide region 26 is a region of the plate across which the slide 18 can move. In particular the third arm 24 of the slide 18 can move across the slide region 26 as the slide 18 is moved. As illustrated, the slide region 26 does not have a slot exposing a potentiometer behind the plate 18. In other words, the slide region 26 is continuous.

The plate 12 can also include other regions such as regions 28 and 30. As will be described in further detail below, switches, knobs, buttons, indicators, or the like can be disposed in regions 28 and 30. The first arm 20 and the second arm 22 can be disposed on the sides of these regions such that the slide 18 can provide the reduced friction as described above, while not interfering with the regions 28 and 30 over a range of motion of the slide 18.

Figure 2:
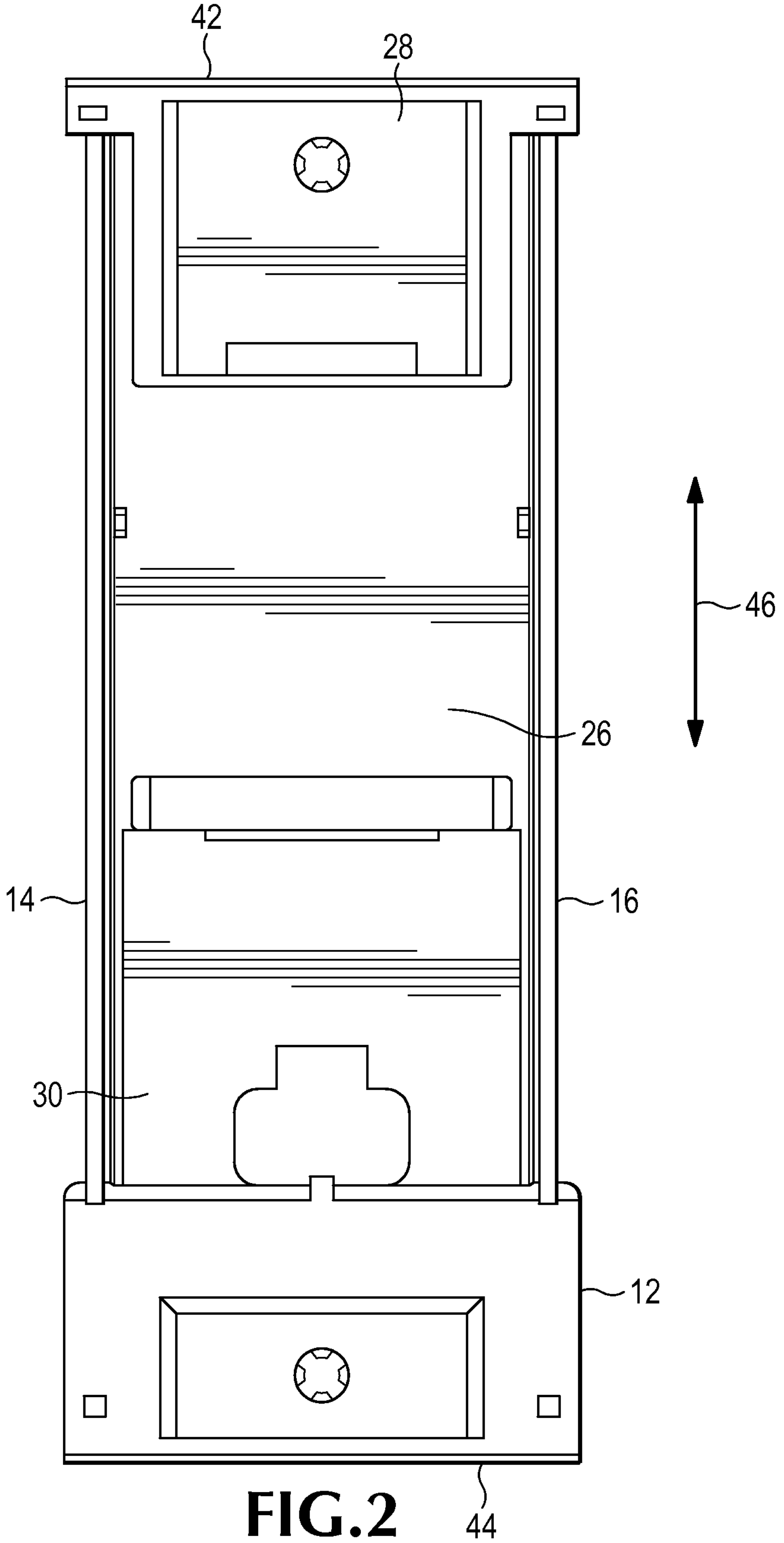
FIG. 2 illustrates an example of a plate of the slide mechanism of FIG. 1 according to some of the inventive principles of this patent disclosure.

FIG. 2 illustrates an example of a plate of the slide mechanism of FIG. 1 according to some of the inventive principles of this patent disclosure. In FIG. 2, the slide 18 has been removed for clarity. In this embodiment, the guides 14 and 16 can be inserted at different times to assembly the slide mechanism 10.

For example, the plate 12 can be provided. The plate 12 can have a first end 42 and a second end 44. The first guide 14 can be inserted into the plate 12. For example, the first guide 14 can be inserted into the first end 42 extended into the plate 12 in direction 46 and captured in the second end 44.

The slide 18 can then be assembled with the first guide 14. For example, the first arm 20 can be coupled to the first guide 14. As will be described in further detail below, the first arm 20 can have a U-shape cross-section. The assembly can place the guide 14 within the U-shape of the first arm 20. The slide 18 can then be positioned on the plate 12.

At this point, the slide 18 may not be constrained relative to the plate 12. That is, the slide 18 may be removable from the plate 12 without the removal of other structures. Accordingly, the second guide 16 can be inserted into the plate 12. The second guide can be inserted through the first end 42 of the plate 12, through the second arm 22 of the slide, and then secured in the second end 44 of the plate 12. Accordingly, the slide 18 can be constrained relative to the plate.

Figure 3:
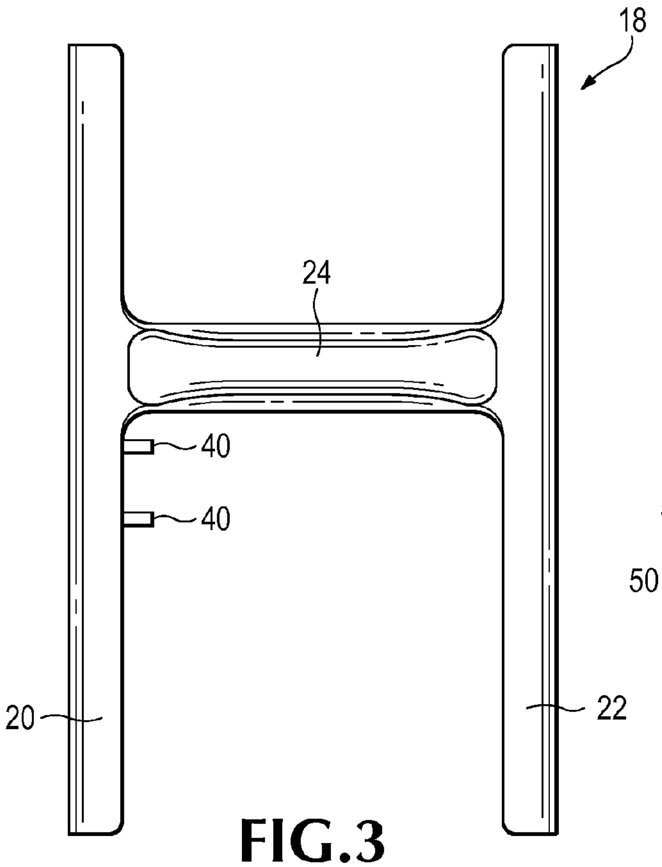
FIG. 3 illustrates an example of a slide of the slide mechanism of FIG. 1 according to some of the inventive principles of this patent disclosure.

FIG. 3 illustrates an example of a slide of the slide mechanism of FIG. 1 according to some of the inventive principles of this patent disclosure. In this embodiment, the third arm 24 is coupled to the first arm 20 at a position along the first arm 20 offset from an end of the first arm 20. Similarly, the third arm 24 is coupled to the second arm 22 at a position along the second arm 22 offset from an end of the second arm 22. Accordingly, as described above, the slide 18 can move along the plate 12 of FIG. 1 and remain substantially outside of regions 28 and 30.

In an embodiment, the third arm 24 can be coupled substantially at a midpoint of the first arm and second arm. Accordingly, regions 28 and 30 of FIG. 1 can be substantially similar in size. However, the third arm 24 need not be coupled at the midpoints. In particular, as illustrated in FIG. 2, the third arm 24 is offset from the midpoints As a result, the regions 28 and 30 of FIG. 1 need not have the same or similar sizes.

Although the size of the regions 28 and 30 described above have been described in relation to the position of the third arm 24 along the first arm 20 and second arm 22, the size of the regions 28 and 30 can be independent of the position. For example, the third arm 24 can be positioned at the midpoints of the first arm 20 and second arm 22, while regions 28 and 30 of FIG. 1 have different sizes.

In an embodiment, the slide 18 can include a structure 40 configured to be coupled to an actuator. For example, the structure 40 can be configured to be coupled to an actuator of a potentiometer for dimming control.

Figure 4:
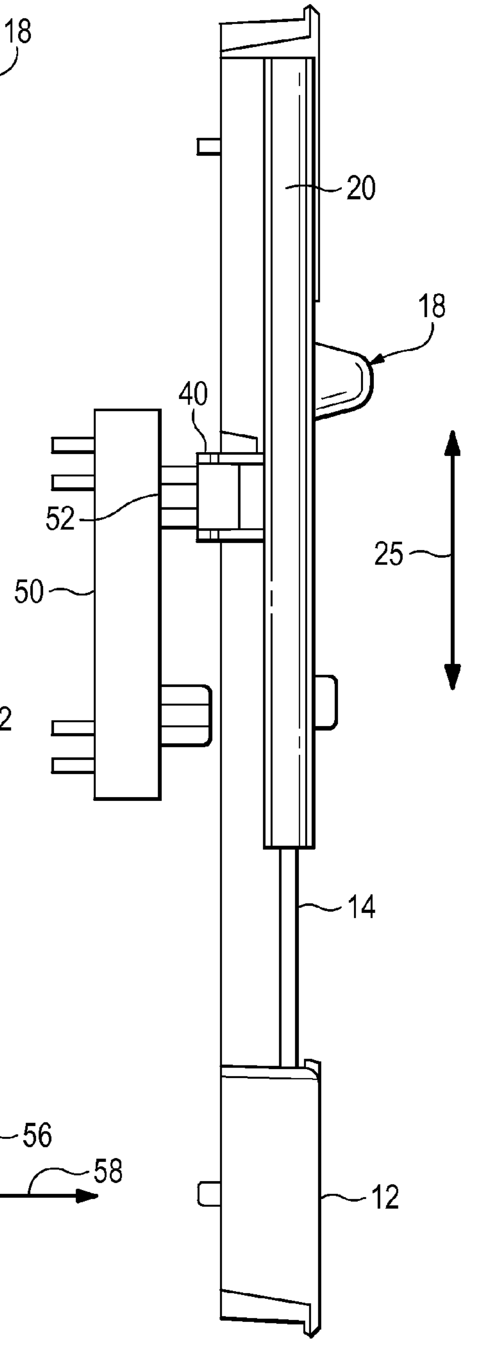
FIG. 4 illustrates an embodiment of a slide mechanism coupled to an encoder according to some of the inventive principles of this patent disclosure.

FIG. 4 illustrates an embodiment of a slide mechanism coupled to an encoder according to some of the inventive principles of this patent disclosure. An encoder can be any variety of devices that can transform a motion into a signal and/or create a state corresponding to the motion. In this embodiment, a potentiometer 50 can be used as such an encoder. The potentiometer 50 includes an actuator 52. As described above, the first arm 20 of the slide 18 can include the structure 40. The structure 40 can be coupled to the actuator 52. In particular, the structure 40 can be a protrusion that constrains the actuator 52. Thus, as the slide 18 is moved along direction 25, the actuator 52 is also moved.

Since the encoder need not be a potentiometer 50, the slide 18 can be suitably configured to actuate the encoder. For example, the encoder can include an optical encoder with an optical sensor can be used to sense an optical beam. The structure 40 of the slide 18 can be configured to periodically interrupt the optical beam, providing a signal related to the movement of the slide 18. In another example, the slide 18 can include a pattern that can be sensed by the optical encoder. Any sensor/actuator combination, whether wholly within the slide 18, independent of the slide 18, or partially formed by the slide 18 can be used.

Figure 5:
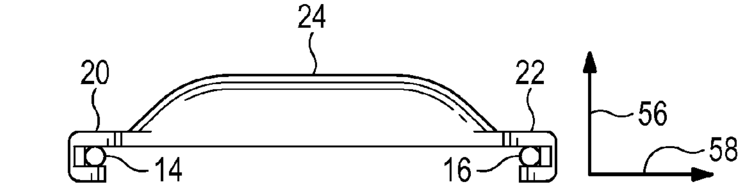
FIG. 5 is a cross-sectional view of the slide and guides of the slide mechanism of FIG. 1 according to some of the inventive principles of this patent disclosure.

FIG. 5 is a cross-sectional view of the slide and guides of the slide mechanism of FIG. 1 according to some of the inventive principles of this patent disclosure. As described above, the slide 18 has substantially a u-shape. First guide 14 and second guide 16 are illustrated disposed within the U-shape of the first arm 20 and second arm 22, respectively.

Accordingly, the first guide 14 and the second guide 16 can constrain the slide 18. As illustrated, the guides 14 and 16 constrain the slide 18 in directions 56 and 58. As described above, if only the first guide 14 is present, the slide 18 may not be constrained. For example, the slide 18 could move along direction 58 off of the guide 14. In addition, the slide 14 could rotate about guide 14.

Although the greater freedom of movement of the slide 18 can cause the slide 18 to detach from the first guide 18, as described above, the freedom of movement can be used to assembly the slide 18 with the plate. That is, the slide 18 is assembled with the first guide 14, then rotated into position where the slide 18 would be if the slide were constrained by the second guide 16. The second guide 16 can be assembled with the plate 12, passing through the second arm 22 and constraining the slide 18 as illustrated.

Figure 6:
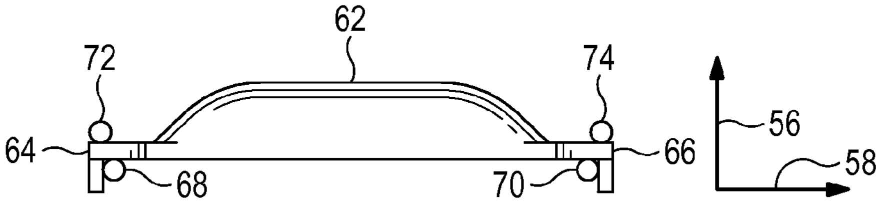
FIG. 6 is a cross-sectional view of a slide and guides of another slide mechanism according to some of the inventive principles of this patent disclosure.

FIG. 6 is a cross-sectional view of a slide and guides of another slide mechanism according to some of the inventive principles of this patent disclosure. Although two guides have been described above as constraining the slide 18, additional guides can be used. For example, the slide 62 is constrained by guides 68, 70, 72, and 74. Guides 68 and 72 constrain a first arm 64 while guides 70 and 74 constrain a second arm 66.

In this embodiment, the first arm 64 and second arm 66 are each substantially an L-shape. Thus, guides 68 and 70 can constrain the motion of the slide 62 along direction 58. However, the guides 68 and 70 may not constrain the slide 62 along direction 56. Accordingly, guides 72 and 74 can be disposed such that the slide 62 is also constrained in direction 56.

In an embodiment, the various guides described above can be formed from wires. That is, the guides can have a substantially circular cross-section. However, in other embodiments, the guides can have other shapes. For example, the guides can have rectangular cross-sections, elliptical cross-sections, or the like. Any shape can be used.

Moreover, although a U-shape and an L-shape cross-section have been described for the arms of a slide, the arms can have a variety of cross-sections. For example, the cross-sections of the arms can be dependent on the cross-sections of the guides. For example, an octagonally shaped arm can be matched with an octagonally shaped guide. However, in other embodiments, the shapes of the guides and arms can be different and/or unrelated.

Figure 7:
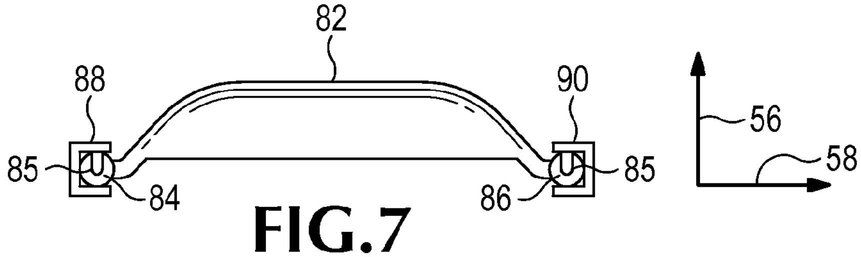
FIG. 7 is a cross-sectional view of a slide and guides of another slide mechanism according to some of the inventive principles of this patent disclosure.

FIG. 7 is a cross-sectional view of a slide and guides of another slide mechanism according to some of the inventive principles of this patent disclosure. In this embodiment, the slide 82 includes arms 84 and 86. The arms each have a substantially circular cross-section. Although in this embodiment, the arms 84 and 86 have notches 85, the arms 84 and 86 are still considered substantially circular in cross-section.

In this embodiment, the guides 88 and 90 each have substantially a U-shape cross-section. The arms 84 and 86 are respectively disposed in the U-shape of the guides 88 and 90. Accordingly, the slide 82 can be constrained in directions 56 and 58. Similar to the arms of the slide and the guides described above, where the guide has a shape such that the arm is disposed within the guide, the arms and guides can similarly have any shape as desired.

Figure 8:
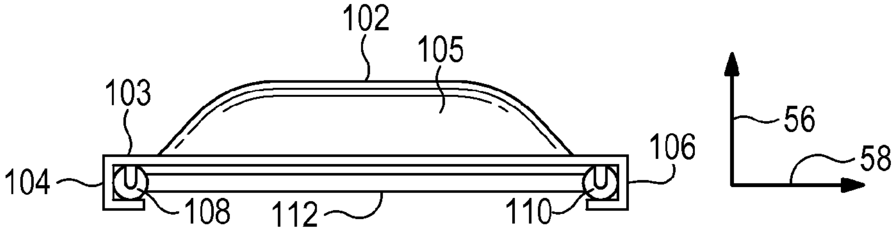
FIG. 8 is a cross-sectional view of a slide and guides of another slide mechanism according to some of the inventive principles of this patent disclosure.

FIG. 8 is a cross-sectional view of a slide and guides of another slide mechanism according to some of the inventive principles of this patent disclosure. In this embodiment, the slide 102 includes a frame 103. The frame 103 includes a first arm 104 and a second arm 106. The frame is shaped to wrap around the guides 108 and 110. However, in this embodiment, the guides 108 and 110 are part of the plate 112.

In contrast, as described above, the guides can be separate from the plate and, in particular, a different material from the plate. However, in this embodiment, the guides 108 and 110 can be formed of the same material as the plate 112. For example, the guides 108 and 110, and the plate 112 can all be formed of a plastic. The frame 103 of the slide 102 can be formed of a different material. For example, the frame 103 can be formed of a metal. Accordingly, the contact between different materials for the sliding interface between the slide 102 and the plate 112 can be maintained.

In an embodiment, a lever 105 of the slide 102 can be a different material. For example, as described above, the frame 103 can be formed of a metal. However, a metal may not have a desired feel for such a slide mechanism. Accordingly, the lever 105 can be formed of a different material, such as a plastic, to achieve the desired feel.

Although as described above, guides have been used to substantially constrain the slide except in the direction over which the slide is actuated, the guides need not be the complete structure that constrains the slide to such motion. For example, referring back to FIG. 6, guides 72 and 74 may not be present. Accordingly, the slide 62 may not be constrained along direction 56. However, other structures, for example, another structure of the plate, a faceplate of the slide mechanism, or the like can further constrain the slide 62 such that the desired range of motion can be achieved.

Figure 9:
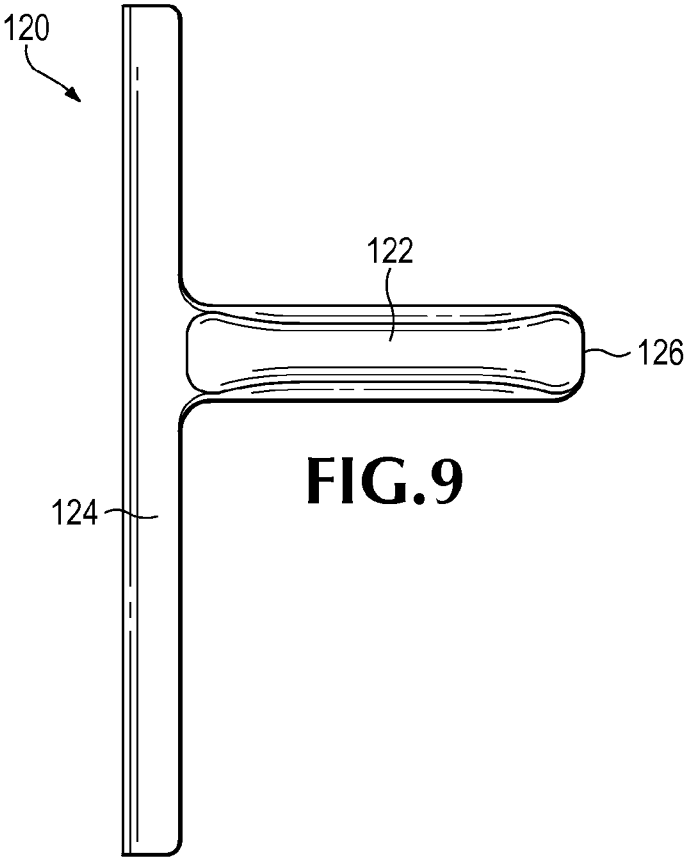
FIG. 9 illustrates a slide of another slide mechanism according to some of the inventive principles of this patent disclosure.

FIG. 9 illustrates a slide of another slide mechanism according to some of the inventive principles of this patent disclosure. As described above, the slide can have two or more arms. However, in this embodiment, the slide 120 includes a single arm 124 and a lever 122, similar to the third arm of previously described slides. The arm 124 can be constrained by guides, the plate, or other structures as described above. The length of the arm 124 can contribute to the stability and ability to move the slide as described above, even though there is only one arm.

In an embodiment, the end 126 of the lever 122 can be free while the arm 124 used to constrain the motion of the slide 120. However, another embodiment, and end 126 of the lever 122 can be constrained by a guide, a plate, or another structure. Accordingly, in an embodiment, the arms and guides can, but need not be symmetrical, have similar shapes, or the like.

Figure 10:
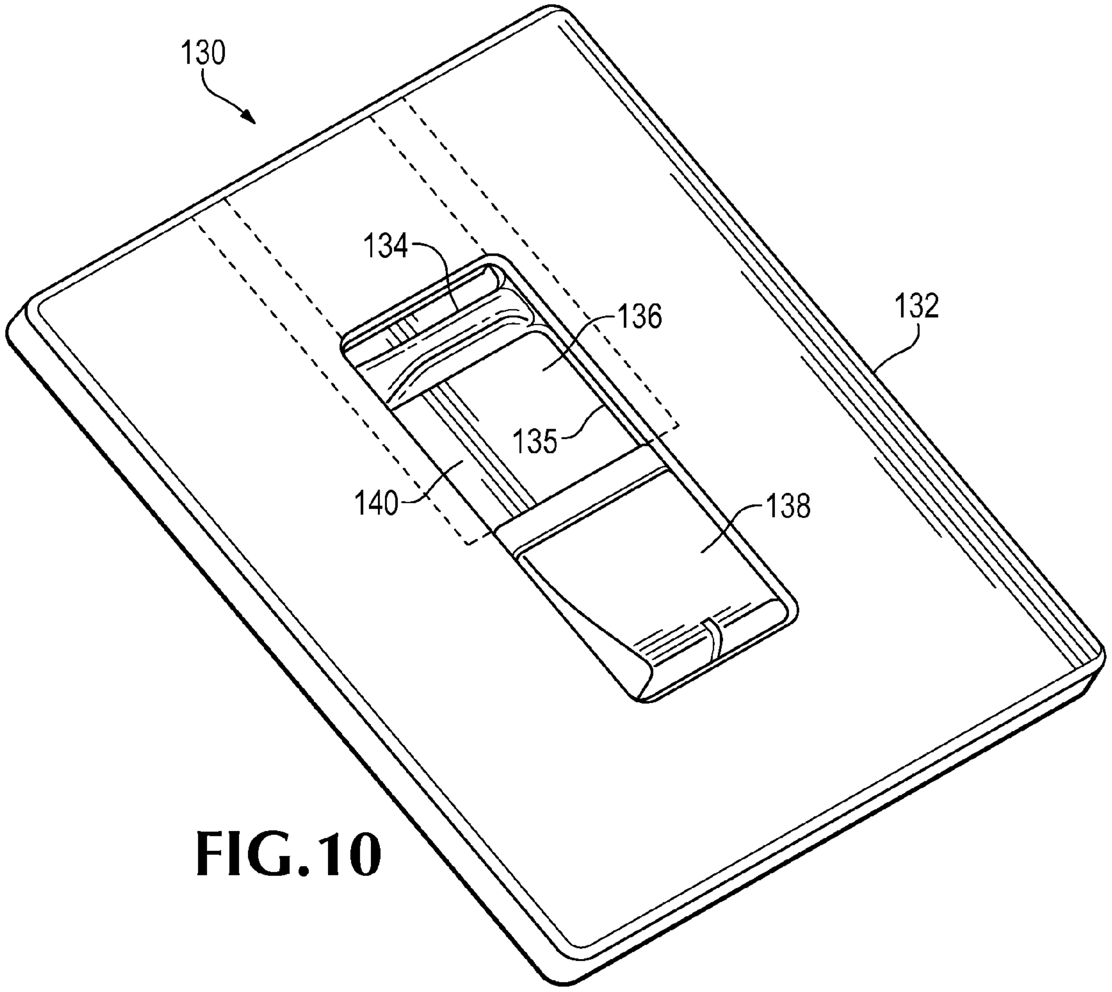
FIG. 10 illustrates an embodiment of another slide mechanism according to some of the inventive principles of this patent disclosure.

FIG. 10 illustrates an embodiment of another slide mechanism according to some of the inventive principles of this patent disclosure. In this embodiment, the slide mechanism 130 includes a faceplate 132. The plate of the slide, as described above, will be referred to as a backplate to distinguish the faceplate 130. The slide 134 has a first arm and a second arm; however, in this embodiment, the first arm and the second arm are concealed by the faceplate 132 as illustrated in phantom. However, a portion 135 of one of the arms is visible between the faceplate 132 and the slide region 136 of the backplate. That is, a gap can be present between the faceplate 132 and the slide region 136 of the back plate. The first and second arms can substantially fill the gap through a range of motion of the slide 134. Thus, the faceplate 132, slide 134, slide region 136, and the like can appear substantially continuous without a discontinuity introduced by a shadow of the gap.

An opening 140 in the faceplate 132 exposes the slide 134. In addition, the opening 140 also exposes the slide region 136 of the backplate. In this embodiment, a switch 138 is also exposed by the opening 140. For example the switch 138 can be disposed in a region 30 of the backplate as illustrated in FIG. 1. Although not illustrated, in an embodiment, another device, interface, or the like can be disposed in region 28 of the backplate of FIG. 1. Accordingly, multiple switches 138 or other structures can be exposed through the opening 140 of the faceplate 132.

Although the faceplate 132 has been described as substantially concealing arms of the slide 134, in an embodiment, the arms can be exposed. For example, the arms can be partially exposed through the opening 140. In another embodiment, the arms can be completely exposed through the opening 140. Regardless, in an embodiment, an actuator, an opening exposing the actuator, or the like can be concealed by the faceplate 132 while the slide 134 is accessible.

As described above, in an embodiment the arms of the slide 134 can be disposed on the sides of the regions 28 and 30 of FIG. 1 with particular positions of the slide 134. Since the regions 28 and 30 can include switches, interfaces, or the like, the arms of the slide 134 can be disposed around such structures. For example, when the slide 134 is positioned towards the switch 138, the switch 138 can be disposed between the arms of the slide 134. In particular, in an embodiment, the arms can be disposed on opposite sides of the switch 138. Although a switch 138 has been used as an example, in other embodiments, as described above other structures, such as buttons, indicators, or the like can be used.

Figure 11:
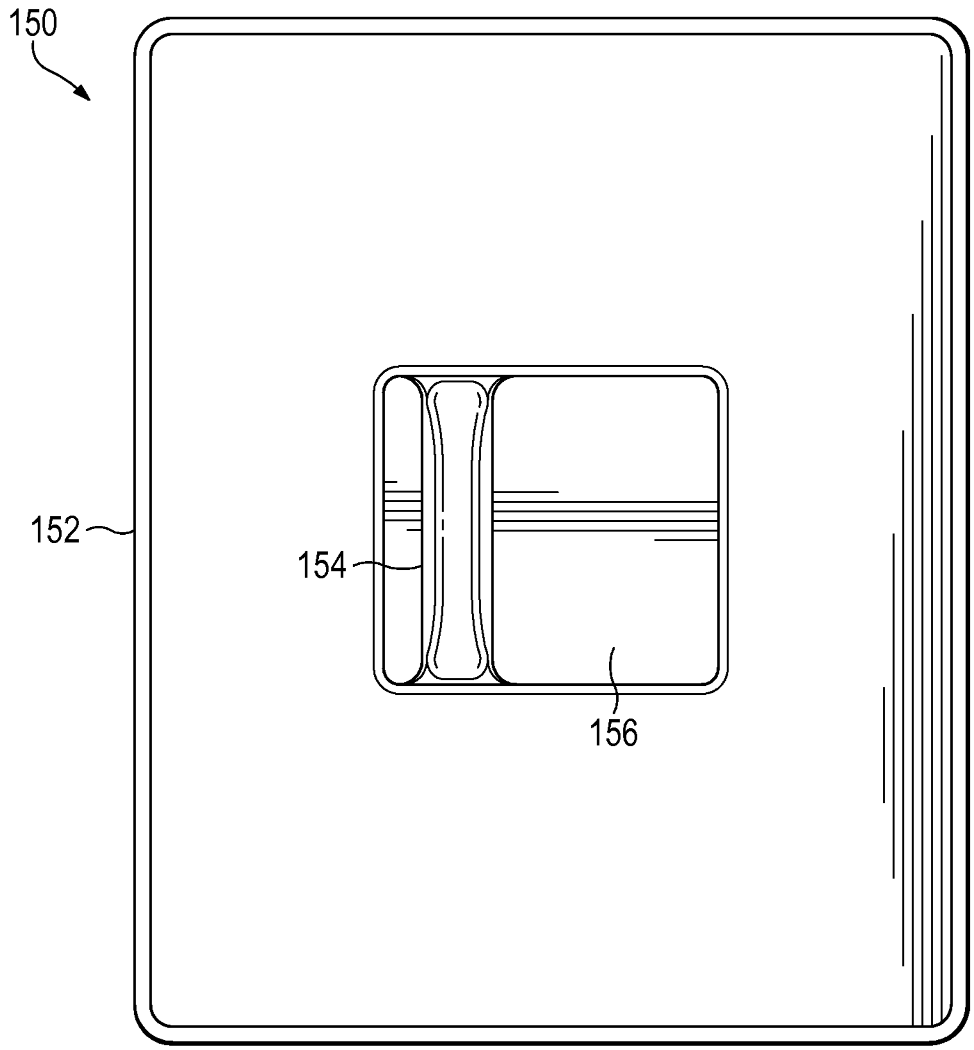
FIG. 11 illustrates an embodiment of another slide mechanism according to some of the inventive principles of this patent disclosure.

FIG. 11 illustrates an embodiment of another slide mechanism according to some of the inventive principles of this patent disclosure. In this embodiment, the slide mechanism 150 includes a faceplate 152. The slide 154 and a slide region 156 are exposed through an opening in the faceplate 152.

As described above, various slides can be actuated in a substantially vertical direction. That is, the slide can be moved up and down. However, the slide mechanism 150 can have any orientation as desired. As illustrated, the slide mechanism 150 is oriented such that the slide 154 can move horizontally. The slide mechanism 150 can have other orientations. For example, the slide mechanism 150 can be mounted on a floor, ceiling, or the like. Thus, the slide 154 can be actuated in a corresponding variety of different directions, depending on how the slide mechanism 150 is disposed.

Moreover, as illustrated, the slide mechanism 150 does not have any additional structures, such as switches, buttons, indicators, or the like. Thus, in an embodiment, only the slide 154 is accessible through the faceplate 152. However, on other embodiments, the orientation of the slide mechanism 150 can be independent of the existence of any additional structures. For example, the slide mechanism 150 could have the switch 138 as described with reference to FIG. 10.

Although a first arm, second arm, first guide, second guide, or the like have been referred to in a particular sequence of first, second, third, etc., such arms, guides, or the like can be referred to in any sequence.

The inventive principles of this patent disclosure have been described above with reference to some specific example embodiments, but these embodiments can be modified in arrangement and detail without departing from the inventive concepts. Such changes and modifications are considered to fall within the scope of the following claims.

The invention claimed is:

1. A system comprising:

a plate having a longitudinal axis;

at least one guide having a longitudinal axis, the at least one guide being coupled to the plate; and a slide slidably coupled to the at least one guide and arranged to travel in a direction of movement, wherein the longitudinal axis of the plate, the longitudinal axis of the at least one guide, and the direction of movement are all parallel, the slide including:

a first arm having a total length that extends along the direction of movement of the slide, the first arm constrained by the at least one guide to travel in the direction of movement, wherein the first arm has a thickness extending in a direction away from the plate, the direction being perpendicular to the longitudinal axis of the plate; and a lever arm having a total length that extends perpendicular to the direction of movement of the slide, the lever arm being coupled to the first arm, wherein the lever arm has a thickness extending in a direction away from the plate, the direction being perpendicular to the longitudinal axis of the plate;

wherein the total length of the first arm is greater than the total length of the lever arm.

2. The system of claim 1, wherein:

the at least one guide is formed of a first material; and the first arm is formed of a second material different from the first material.

3. The system of claim 2, wherein:

the first material is a metal; and the second material is a plastic.

4. The system of claim 2, wherein:

the first material is a plastic; and the second material is a metal.

5. The system of claim 1, wherein:

the lever arm is coupled to the first arm at a position along the first arm offset from an end of the first arm.

6. The system of claim 1, wherein:

the lever arm is coupled to the first arm substantially at a midpoint along the first arm.

7. The system of claim 1, wherein:

the at least one guide includes a first guide and a second guide;

the slide includes a second arm coupled to the lever arm such that the lever arm is coupled between the first arm and the second arm and the second arm is substantially parallel to the first arm;

the first arm is constrained by the first guide; and the second arm is constrained by the second guide.

8. The system of claim 7, wherein:

the first arm has a substantially U-shape and the first guide is disposed within the substantially U-shape of the first arm; and the second arm has a substantially U-shape and the second guide is disposed within the substantially U-shape of the second arm.

9. The system of claim 7, further comprising:

a third guide to constrain the first arm; and a fourth guide to constrain the second arm;

wherein:

the first arm is disposed between the first guide and the third guide; and the second arm is disposed between the second guide and the fourth guide.

10. The system of claim 7, wherein:

the first guide has a substantially U-shape and the first arm is disposed within the substantially U-shape of the first guide; and the second guide has a substantially U-shape and the second arm is disposed within the substantially U-shape of the second guide.

11. The system of claim 1, further comprising:

an encoder including an actuator;

wherein the first arm includes a protrusion to constrain the actuator.

12. The system of claim 1, further comprising:

an encoder;

wherein the first arm forms part of the encoder.

13. The system of claim 1, wherein:

the plate includes a substantially continuous slide region; and the slide is configured such that the lever arm moves along the slide region.

14. The system of claim 13, further comprising:

a switch disposed on the plate in a region adjacent the slide region;

wherein when the slide is positioned towards the switch, the switch is disposed between the first arm and the lever arm.

15. A system, comprising: a faceplate having an opening; a slide including:

a first arm substantially concealed by the faceplate;

a second arm substantially parallel to the first arm and substantially concealed by the faceplate; and a lever arm coupled between the first arm and the second arm and exposed through the opening of the faceplate; a backplate;

a first guide extending along a direction of movement along the backplate, coupled to the backplate, and configured to constrain the first arm of the slide to travel in the direction of movement, wherein the first arm has a thickness extending in a direction away from the backplate; and a second guide extending along the direction of movement along the backplate, coupled to the backplate, and configured to constrain the second arm of the slide to travel in the direction of movement, wherein the second arm has a thickness extending in a direction away from the backplate;

wherein a total length of the first arm extending along the first direction of movement is greater than a total length of the lever arm extending perpendicular to the direction of movement.

16. The system of claim 15, wherein at least a portion of the backplate is exposed through the opening of the faceplate.

17. The system of claim 15, further comprising a switch disposed in the opening.

18. The system of claim 17, wherein when the lever arm of the slide is disposed at an end of the opening, the first arm and the second arm of the slide are disposed on opposite sides of the switch.

19. The system of claim 15, wherein the first arm is disposed to substantially fill a gap between the faceplate and the backplate across a range of motion of the slide.

20. The system of claim 1, wherein:

the lever arm extends from the first arm in a second direction substantially perpendicular to the direction of movement; and the total length of the first arm along the direction of movement is greater than the total length of the lever arm along the second direction.

21. The system of claim 1, wherein:

the slide has a range of motion along the direction of motion; and the total length of the first arm along the direction of movement is greater than the range of motion of the slide.

22. The system of claim 15, wherein:

the lever arm extends between the first arm and the second arm in a second direction substantially perpendicular to the direction of movement; and the total length of the extent of the first arm along the direction of movement is greater than the total length of an extent of the lever arm along the second direction.

23. The system of claim 15, wherein:

the slide has a range of motion along the direction of motion; and the extent of the first arm along the direction of movement is greater than the range of motion of the slide.

24. The system of claim 1, wherein the lever arm is in direct contact with the first arm.

25. The system of claim 15, wherein the lever arm is in direct contact with the first arm.

26. The system of claim 25, wherein the lever arm is in direct contact with the second arm.

* * * * *